United States Patent
Ady et al.

(10) Patent No.: US 9,698,132 B1
(45) Date of Patent: Jul. 4, 2017

(54) CHIP PACKAGE STACK UP FOR HEAT DISSIPATION

(71) Applicant: Motorola Mobility LLC, Chicago, IL (US)

(72) Inventors: Roger Ady, Chicago, IL (US); Morris Bowers, Grayslake, IL (US); Paul Crosbie, Grayslake, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/238,849

(22) Filed: Aug. 17, 2016

(51) Int. Cl.
| H01L 23/34 | (2006.01) |
| H01L 25/18 | (2006.01) |
| H01L 25/065 | (2006.01) |
| H01L 23/373 | (2006.01) |
| H01L 23/367 | (2006.01) |
| H01L 23/427 | (2006.01) |
| H01L 23/552 | (2006.01) |
| H01L 23/00 | (2006.01) |

(52) U.S. Cl.
CPC .......... *H01L 25/18* (2013.01); *H01L 23/3675* (2013.01); *H01L 23/373* (2013.01); *H01L 23/3736* (2013.01); *H01L 23/3737* (2013.01); *H01L 23/427* (2013.01); *H01L 23/552* (2013.01); *H01L 24/17* (2013.01); *H01L 25/0657* (2013.01); *H01L 2224/16225* (2013.01); *H01L 2225/06517* (2013.01); *H01L 2225/06572* (2013.01); *H01L 2225/06589* (2013.01); *H01L 2924/01029* (2013.01); *H01L 2924/1434* (2013.01); *H01L 2924/3025* (2013.01)

(58) Field of Classification Search
CPC ............... H01L 23/3675; H01L 23/373; H01L 23/3736; H01L 23/3737; H01L 23/427; H01L 23/552; H01L 23/17
USPC ........................................................ 257/713
See application file for complete search history.

(56) References Cited

U.S. PATENT DOCUMENTS

| 2012/0230001 A1* | 9/2012 | Takahashi | H01L 23/3128 361/808 |
| 2013/0091315 A1* | 4/2013 | Ken | G06F 13/4018 710/307 |
| 2015/0236002 A1* | 8/2015 | Haba | H01L 25/18 257/713 |

* cited by examiner

Primary Examiner — Trung Q Dang
(74) Attorney, Agent, or Firm — Cygan Law Offices P.C.; Joseph T. Cygan

(57) ABSTRACT

A chip package stack up includes a processor chip package that has a top surface and a bottom surface, an interposer, disposed above and connected to the processor chip package top surface; a memory chip package disposed above the interposer and connected to the processor chip package through the interposer; and a processor chip package heat spreader having a bottom surface adhered to the processor chip package top surface, and having an extending portion that extends outwardly from an edge of the processor chip package.

19 Claims, 5 Drawing Sheets

- PRIOR ART -

CHIP PACKAGE STACK UP FOR HEAT DISSIPATION

FIELD OF THE DISCLOSURE

The present disclosure relates generally to chip package heat spreaders and more particularly to heat dissipation in chip package on package (PoP) stack ups.

BACKGROUND

Microprocessor integrated circuit (IC) packages and memory IC packages (ICs being also referred to as "chips") are often arranged in a stacked configuration using solder ball grid array (BGA) connections between the processor and memory chip packages in order to save horizontal space on a printed circuit board (PCB). These stack ups are referred to as PoP (Package-on-Package) configurations. FIG. 1 illustrates one example of a known chip package stack up 100. The stack up 100 extends upwardly in the z-axis direction away from a main PCB 101 surface as indicated by the +Z arrow direction. A first BGA 103 connects the processor chip package 105 to the main PCB 101 and a second BGA 107 connects the memory chip package 109 to the processor chip package 105. A shield fence 113 surrounds the chip stack up to provide electromagnetic shielding.

A copper conductor 111 such as a copper tape, is positioned above the shield fence 113, as the shield fence cover, such that it comes in contact with the upper surface of the memory chip package 109 and provides a thermal pathway away from the memory chip package 109 surface. The copper conductor 111 may be a copper tape. A heat spreader 115, such as a graphite sheet, is in contact with the copper conductor 111 such that heat from the memory chip package 109 is dissipated through the copper conductor 111 and upward through the heat spreader 115, the top surface of which provides a heat dissipation surface area. Although the copper conductor 111 and heat spreader 115 are shown being substantially horizontal, both the copper conductor 111 and heat spreader 115 are flexible and may slope downwardly as needed in order to come into contact with the upper surface of the memory chip package 109.

The challenge for a stack up such as example stack up 100 is that the processor chip package 105 (which may include multiple processor chips within the chip package) generates the greater amount of heat versus the memory chip package 109. In the example stack up 100, the heat generated by the processor chip package 105 can only flow downward through the BGA 103 to the PCB 101, or can flow upward through the memory chip package 109 to the copper conductor 111 and the heat spreader 115. Neither of these thermal pathways is efficient for heat dissipation from the processor chip package 105 because the PCB 101 is not particularly thermally conductive, and the number of BGA connections between the memory chip package 109 and the processor chip package 105 is only a fraction of the BGA connections between the processor chip package 105 and the PCB 101 which further limits the amount of thermal conduction that can occur in the upward direction. Additionally, stagnant air between the processor chip package 105 and the memory chip package 109 becomes heated thereby creating an environment that heats up the memory chip package 109 which is very undesirable for memory chip performance among other considerations.

DETAILED DESCRIPTION

Figure 1:
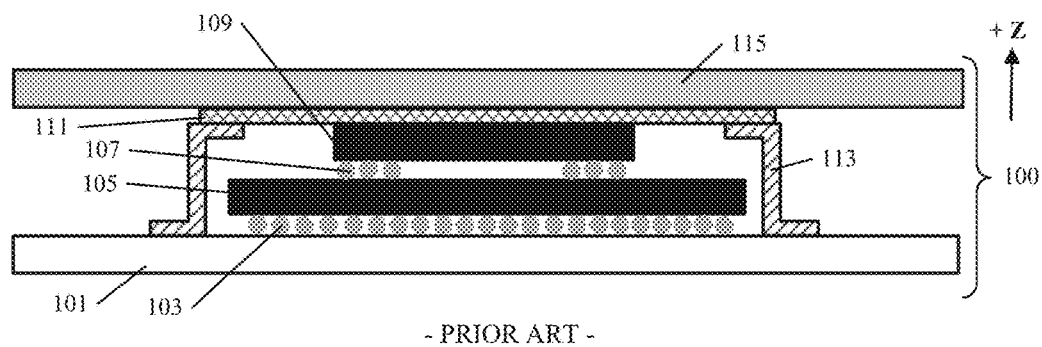
FIG. 1 is a cross-sectional side view of a known chip package stack up illustrating a known heat spreader configuration.

The present disclosure provides various chip package stack ups that include a processor chip package heat spreader disposed between a processor chip package and a memory chip package in a package-on-package (PoP) configuration. The heat spreader provides a thermal conductance path for heat dissipation directly from the processor chip package which helps prevent undesirable heating of the memory chip package.

One disclosed embodiment includes a processor chip package having a top surface and a bottom surface; an interposer, disposed above and connected to the processor chip package top surface; a memory chip package disposed above the interposer and connected to the processor chip package through the interposer; and a processor chip package heat spreader having a bottom surface adhered to the processor chip package top surface, and having an extending portion that extends outwardly from an edge of the processor chip package.

The processor chip package heat spreader or may be a heat pipe in some embodiments. In one example, processor chip package heat spreader may include at least one polyethylene terephthalate (PET) carrier layer and at least one graphite layer.

In another embodiment, the processor chip package heat spreader extending portion may be folded over a top surface of the memory chip package such that a portion of the processor chip package heat spreader top surface is adhered to the memory chip package top surface.

An example embodiment of a printed circuit board (PCB) assembly includes a PCB connected to the processor chip package by a ball grid array on the processor chip package bottom surface; a shield fence surrounding the processor chip package and the memory chip package; copper tape forming a cover over the shield fence and having a bottom surface adhered to the memory chip package top surface; a second heat spreader adhered to the copper tape top surface; and a contact point between the top surface of the processor chip package heat spreader extending portion and the second heat spreader bottom surface.

Another example embodiment of a PCB assembly includes a PCB connected to the processor chip package by a ball grid array on the processor chip package bottom surface; a shield fence surrounding the processor chip package and the memory chip package; copper tape forming a cover over the shield fence and having a bottom surface adhered to the memory chip package top surface; a second heat spreader adhered to the copper tape top surface; and a contact point between the top surface of the processor chip package heat spreader extending portion and the copper tape bottom surface, the contact point being within the shield fence.

Another example embodiment of a PCB assembly that uses a chip package stack up with a heat spreader folded over and adhered to a memory chip package, includes a PCB connected to the processor chip package by a ball grid array on the processor chip package bottom surface; a shield fence surrounding the processor chip package and the memory chip package; copper tape forming a cover over the shield fence and having a bottom surface adhered to the bottom surface of the processor chip package heat spreader extending portion; and a second heat spreader adhered to the copper tape top surface.

Another disclosed embodiment of a chip package stack up includes a processor chip package having a top surface and a bottom surface; two rectangular interposers, disposed above and connected to the processor chip package top surface; a memory chip package disposed above the two interposers and connected to the processor chip package through the two interposers; and a heat spreader having a bottom surface adhered to the processor chip package top surface, and having two extending portions that extend outwardly from two edges of the processor chip package. The processor chip package heat spreader may be a graphite heat spreader or, in some embodiments, may be one or more heat pipes.

An example embodiment of a PCB assembly that uses the above chip package stack up includes a PCB connected to the processor chip package by a ball grid array on the processor chip package bottom surface; a shield fence surrounding the processor chip package and the memory chip package; copper tape forming a cover over the shield fence and having a bottom surface adhered to the memory chip package top surface; a second heat spreader adhered to the copper tape top surface; and two contact points between the top surfaces of the two processor chip package heat spreader extending portions and the second heat spreader bottom surface.

The present disclosure also provides methods that may be performed, in whole or in part, by fabrication and assembly equipment such as, but not limited to, one or more surface mount technology (SMT) machines with computer numerical control (CNC) etc.

One disclosed method includes providing a processor chip package that has BGA (ball grid array) connections on a bottom surface for connection to a PCB; positioning a heat spreader above the processor chip package top surface and adhering the heat spreader to the processor chip package top surface such that a portion of the heat spreader extends away from the processor chip package; positioning an interposer that has BGA connections on its lower surface and soldering the BGA connections to connections on an upper surface of the processor chip package; and positioning and soldering a memory chip package that has BGA connections to the interposer. In some embodiments, the method may also include wrapping the heat spreader around such that its upper surface contacts the upper surface of the memory chip package and adhering the heat spreader to the memory chip package.

Another disclosed method includes providing a processor chip package that has BGA connections on a bottom surface for connection to a PCB; positioning two like interposers in parallel and soldering the interposer BGA connections to the upper surface of the processor chip package; positioning a heat spreader between the two parallel interposers, and adhering the heat spreader to the processor chip package upper surface, leaving two portions of the heat spreader extending away from the processor chip package at opposite edges of the processor chip package; and positioning a memory chip package that has BGA connections for connection to the two parallel interposers and soldering the BGA connections to the interposers.

Figure 2:
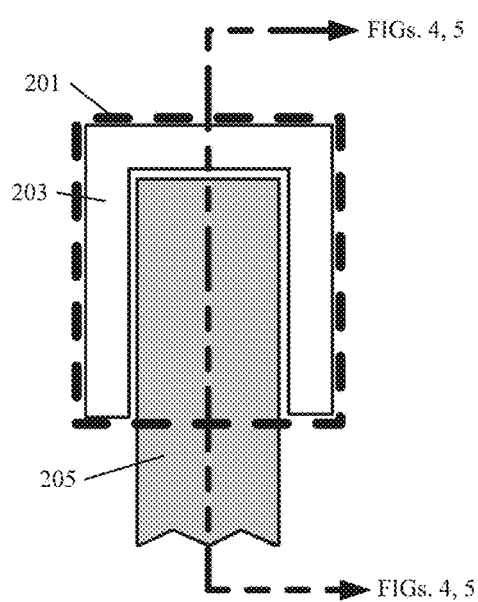
FIG. 2 is a cutaway top view of a chip package stack up having a heat spreader configuration in accordance with an embodiment.

Turning now to the drawings wherein like numerals represent like components, FIG. 2 is a cutaway top view of a chip package stack up in accordance with an embodiment. It is to be understood that FIG. 2, as well as other figures provided herein, are not to scale and may have some dimensions exaggerated in order to show details and to facilitate description of chip package stack ups in accordance with the various embodiments. In FIG. 2, an interposer 203 is positioned above a processor chip package 201 (which is outlined by a dashed line). The interposer 203 has a rectangular horseshoe-like shape, or rectangular U-shape, such that a heat spreader 205 may be positioned on the top surface of the processor package 201 within the center of the U-shape. More particularly, the interposer 203 includes a transverse member parallel to one edge of the processor chip package 201, and two parallel members that are perpendicular to each end of the transverse member. Put another way, the interposer may be considered a rectangle that has a rectangular cutout centered such that one edge of the interposer has an opening. The heat spreader is disposed within the rectangular cutout between the two parallel members of the interposer 203 and is adhered to the processor chip package 201 using known adhesives. The heat spreader 205 length is provided such that the heat spreader 205 extends away from the processor chip package 201 and can form a thermal conduction contact away from the processor chip package 201 within a PCB assembly, for dissipating heat generated by the processor chip package 201.

Figure 3:
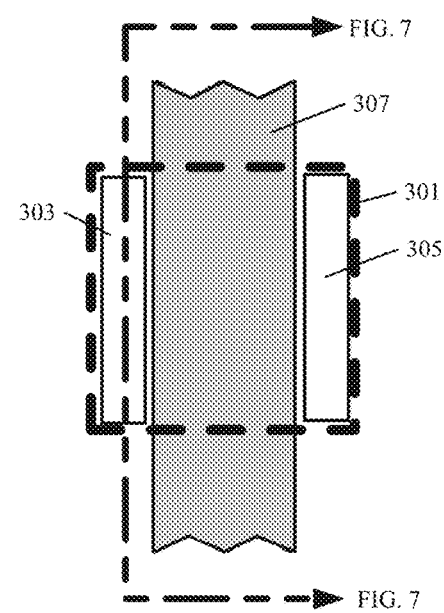
FIG. 3 is a cutaway top view of a chip package stack up having a heat spreader configuration in accordance with another embodiment.

FIG. 3 is a cutaway top view of a chip package stack up having a heat spreader configuration in accordance with another embodiment. In FIG. 3, two parallel interposers 303 and 305 are positioned above a processor chip package 301 (also outlined by a dashed line) with each interposer parallel with an opposing edge of the processor chip package 301. The parallel interposers 303 and 305 allow for a heat spreader 307 to be adhered to the top surface of the processor chip package 301 between the interposers 303, 305 and to extend outwardly in two directions away from the processor chip package 301, to provide thermal conduction contacts at two points outside the perimeter of the processor chip package 301 within a PCB assembly.

Figure 4:
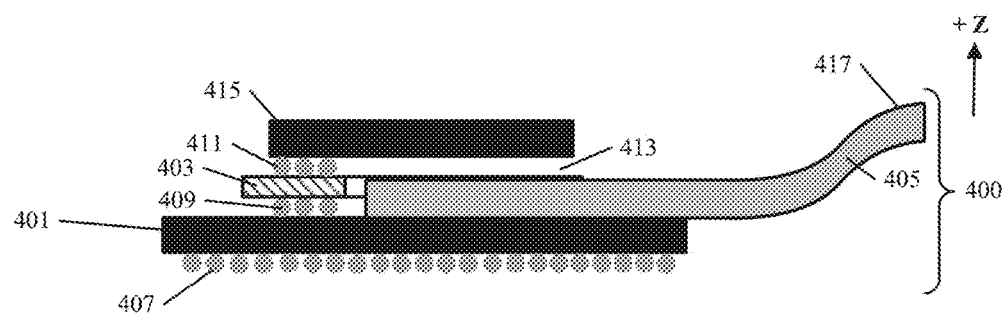
FIG. 4 is a cross-sectional side view of a chip package stack up that uses the heat spreader configuration example shown in FIG. 2 in accordance with an embodiment.

FIG. 4 is a cross-sectional side view of an example chip package stack up 400 that uses the example heat spreader configuration shown in FIG. 2 in accordance with an embodiment. The example chip package stack up 400 is an assembly that may be made and sold by a chip original equipment manufacturer (OEM). In the example chip package stack up 400, a processor chip package 401 includes a BGA 407 for connection to a PCB. A interposer 403, which has a top view similar to the interposer 203 shown in FIG. 2, is disposed above the processor chip package 401 and includes a lower BGA 409 and pass-through connections such as via (not shown) which extend the processor chip package 401 connections. More specifically, the interposer 403 has a transverse member extending perpendicularly into the plane of the drawing (shown cross-hatched) and two parallel members perpendicular to the transverse member at each end, extending from each end of the transverse member to form a rectangular U-shape or rectangular horseshoe-like shape. In some embodiments, the interposer may be constructed using PCB board where the pass-through connections are PCB via and a BGA is provided on the bottom surface of the PCB board. The top surface of the PCB board may have appropriate bumps (or "pads") for connecting to BGA connections on a memory chip package bottom surface. In some embodiments, the interposer may be a connector that can form the connection between the processor chip package and the memory chip package, and elevate the memory chip package such that the processor chip package heat spreader can be present on the top surface of the processor chip package while still leaving a small air gap 413.

A memory chip package 415 includes BGA 411 for connection to the upper surface of the interposer 403. The BGA 411 connects to respective bumps and via (not shown) of the interposer 403, and form connections through BGA 409 into the processor chip package 401. A heat spreader 405 is positioned between the parallel members of the interposer 403, and in contact with the processor chip package 401 and is adhered using known adhesives. As shown in FIG. 4, the heat spreader 405 has a portion that extends beyond the edge of the processor chip package 401 so that the heat spreader upper surface 417 may form a thermal contact with an appropriate point within a PCB assembly. An air gap 413 remains between the upper surface 417 of the heat spreader 405 and the lower surface of the memory chip package 415.

It is to be understood that the terms "upper" and "lower" as used herein are relative terms used to describe the position of various surfaces with respect to one another and with respect to a PCB assembly but not to limit the subject matter described in any respect. In one usage, the terms "upper" and "lower" as used herein refer to position with respect to a z-axis where the z-axis is orthogonal to an x-y plane. A PCB is considered herein as forming an x-y plane such that the z-axis, "+Z" direction is outward and away from the plane of the PCB. In one example usage, a "lower surface" (or "bottom surface") as used herein may be a surface that faces toward a PCB plane (-Z direction), and an "upper surface" (or "top surface") as used herein may be a surface that faces away from, or in the same direction as, the PCB plane (+Z direction). However, in another example usage herein, a flexible material may be folded so that part of its "upper surface" (or "top surface") faces the +Z direction while part of the "upper surface" or "top surface" is folded over such that it faces the −Z direction.

Figure 5:
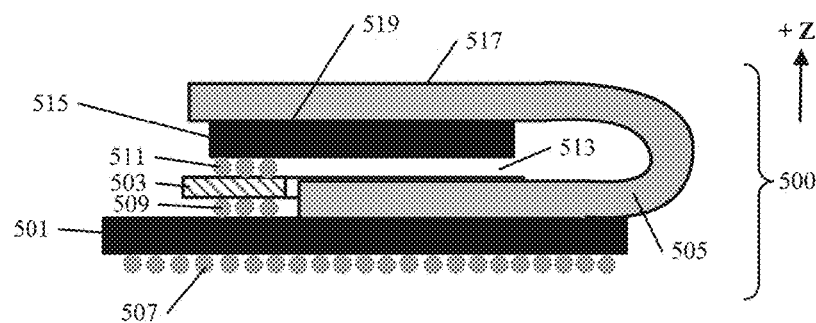
FIG. 5 is a cross-sectional side view of another chip package stack up that uses the heat spreader configuration example shown in FIG. 2 in accordance with an embodiment.

FIG. 5 is a cross-sectional side view of another example chip package stack up 500 that uses the example heat spreader configuration shown in FIG. 2 in accordance with an embodiment. The example chip package stack up 500 is likewise an assembly that may be made and sold by a chip OEM. The stack up 500 is similar to stack up 400 and includes a processor chip package 501 with a BGA 507 for connection to a PCB. An interposer 503 has a top view similar to the interposer 203 shown in FIG. 2, with a transverse member (shown cross-hatched) and two parallel members, perpendicular to the transverse member at each end to form a rectangular U-shape or rectangular horseshoe-like shape. The interpose 503 is disposed above the processor chip package 501 and includes a lower BGA 509 and PCB bumps (or "pads") and via (not shown) which extend the processor chip package 501 connections. A memory chip package 515 includes BGA 511 for connection to the upper surface of the interposer 503. The BGA 511 connect to respective bumps and via of the interposer 503, and form connections through BGA 509 into the processor chip package 501. A heat spreader 505 is positioned between the parallel members of the interposer 503 and in contact with the processor chip package 501 and is adhered using known adhesives. However, in the example stack up 500, the heat spreader 505 is curved or folded back over the upper surface of the memory chip package 515. The heat spreader 505 upper surface 519 is adhered to the upper surface of the memory chip package 515 using a known adhesive. The upwardly facing, folded portion of the heat spreader lower surface 517 is available to form a thermal conduction contact within a PCB assembly. An air gap 513 remains between the upper surface of the heat spreader 505 and the lower surface of the memory chip package 515.

Figure 6:
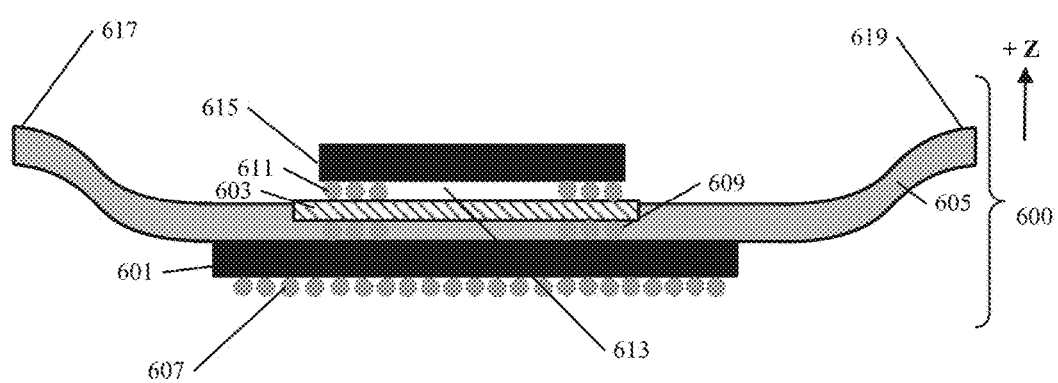
FIG. 6 is a cross-sectional side view of a chip package stack up that uses the heat spreader configuration example shown in FIG. 3 in accordance with an embodiment.

FIG. 6 is a cross-sectional side view of an example chip package stack up 600 that uses the example heat spreader configuration shown in FIG. 3 in accordance with an embodiment. The view of FIG. 6 shows one parallel interposer 603 which is positioned above the processor chip package 601 and connected to the processor chip package 601 by lower BGA 609. The memory chip package 615 is connected to the interposer 603 (as well as the other interposer which is not visible in FIG. 6) by BGA 611. The processor chip package 601 includes BGA 607 for connection to a PCB. A heat spreader 605 is positioned between the two interpose boards, and is adhered to the processor chip package 601 using known adhesive. Two outwardly extending ends 617, 619 extend outward from the edges of the processor chip package 601 to form two thermal conduction connections within a PCB assembly. An air gap 613 remains between the upper surface of the heat spreader 605 and the lower surface of the memory chip package 615.

The various heat spreaders described in the above examples may be a graphite heat spreader that is composed of a Polyethylene terephthalate (PET) carrier (also referred to as polyester tape) with a graphite layer disposed on one surface of the PET carrier. The graphite side may be directly adhered to the chip packages using adhesive in some embodiments. However, the heat spreaders may be multi-layered consisting of one or more graphite layers and one or more PET layers. For example, the heat spreader may have a graphite layer sandwiched between two PET layers to form a PET upper surface and a PET lower surface. A PET layer may then be connected to a chip package surface using adhesive. An example graphite heat spreader stack up may have a thickness on the order of 50 μm or less, and may be as thick as 100 μm. More particularly the heat spreader may be a Pyrolytic Highly Oriented Graphite Sheet (PGS) having a thickness between 10 μm and 100 μm. Multiple PGS layers may be combined together to achieve an overall PGS thickness in some embodiments. An adhesive layer to adhere the heat spreader to a chip package surface maybe approximately 5 μm thick.

Figure 7:
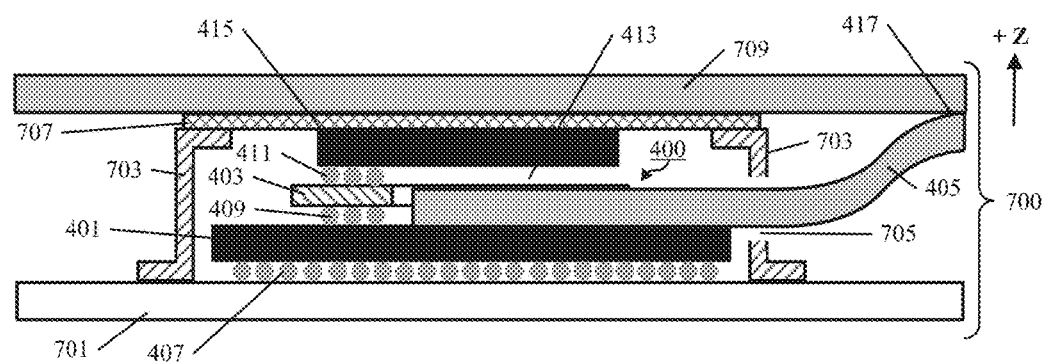
FIG. 7 is a cross-sectional side view of a PCB assembly that uses the chip package stack up of FIG. 4 in accordance with an embodiment.

FIG. 7 is a cross-sectional side view of a PCB assembly 700 that uses the chip package stack up 400 of FIG. 4 in accordance with an embodiment. In the PCB assembly 700, the chip package stack up 400 is connected to the PCB 701 by the BGA 407 of the processor chip package 401. A shield fence 703 (also referred to as a "shield cage") surrounds the outer perimeter of the chip package stack up 400 to block electro-magnetic fields (EMF) generated by the processor chip package 401, and also prevents external EMF from interfering with the processor core. The shield fence 703 is a solderable material such as, but not limited to, nickel plated steel. A shield box is formed by topping the shield fence 703 with copper tape 707 which contacts and adheres to the shield fence 703, and to the upper surface of the memory chip package 415 to form a thermal conductance path while maintaining the EMF shielding. A heat spreader 709 contacts and adheres to the copper tape 707 upper surface and spreads heat in the x-y plane of the PCB assembly 700.

A slot 705 in the shield fence 703 allows the heat spreader 405 to protrude through the slot 705 such that the heat spreader 405 upper surface 417 may form a thermal conductance contact with the lower surface of heat spreader 709. A thermal conductance path is therefore formed from the upper surface of the processor chip package 401 to the external heat spreader 709 to car) heat outside the perimeter of the shield fence 703 and away from the processor chip package 401.

Figure 8:
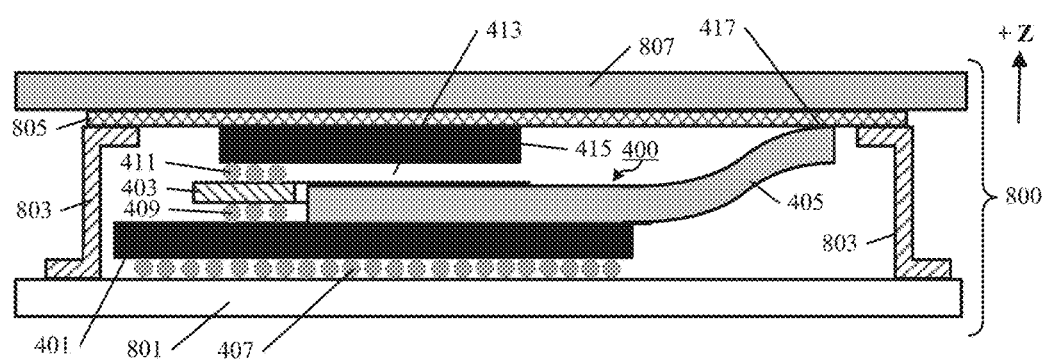
FIG. 8 is a cross-sectional side view of another PCB assembly that uses the chip package stack up of FIG. 4 in accordance with another embodiment.

Another embodiment that makes use of the chip package stack up 400 is shown in FIG. 8 which is a cross-sectional side view of another PCB assembly 800. The PCB assembly 800 includes a PCB 801 connected to the processor chip package 401 using the BGA 407. A shield fence 803 surrounds the chip package stack up 400 including the extending portion of the heat spreader 405. In the PCB assembly 800, the upper surface 417 of the heat spreader 405 extending portion contacts a lower surface of copper tape 805 to form a thermal conductance path through the copper tape 805 to a heat spreader 807. The lower surface of the heat spreader 807 contacts and adheres to the upper surface of the copper tape 805 to dissipate heat in the x-y plane of the PCB assembly 800. The lower surface of the copper tape 805 contacts and adheres to the upper surface of the memory chip package 415 to form a thermal conductance path to the heat spreader 807.

Figure 9:
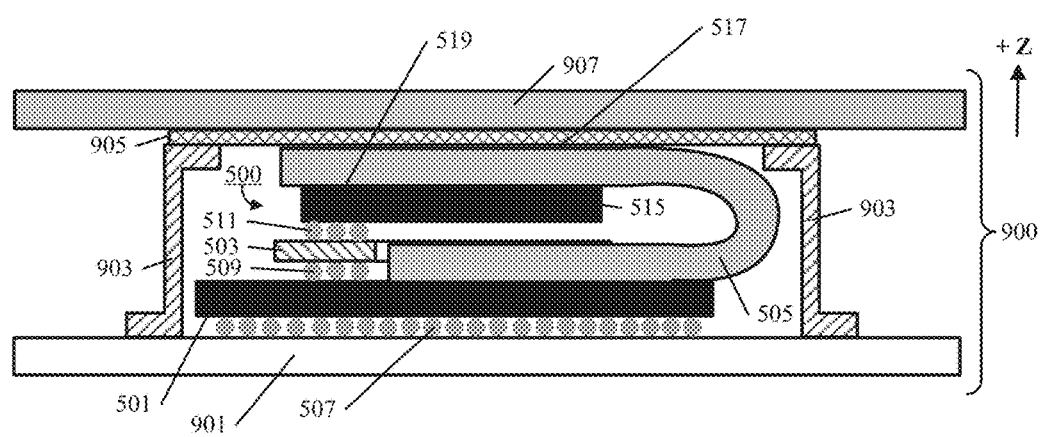
FIG. 9 is a cross-sectional side view of a PCB assembly that uses the chip package stack up of FIG. 5 in accordance with an embodiment.

An embodiment that makes use of the chip package stack up 500 is shown in FIG. 9 which is a cross-sectional side view of a PCB assembly 900. The PCB assembly 900 includes a PCB 901 connected to the processor chip package 501 using the BGA 507. A shield fence 903 surrounds the chip package stack up 500 including the folded portion of the heat spreader 505. In the PCB assembly 900, the upwardly facing, folded portion of the heat spreader lower surface 517 is in contact with, and adheres to, the lower surface of copper tape 905 to form a thermal conductance path through the copper tape 905 to a heat spreader 907. The lower surface of the heat spreader 907 contacts and adheres to the upper surface of the copper tape 905 to dissipate heat in the x-y plane of the PCB assembly 900.

Figure 10:
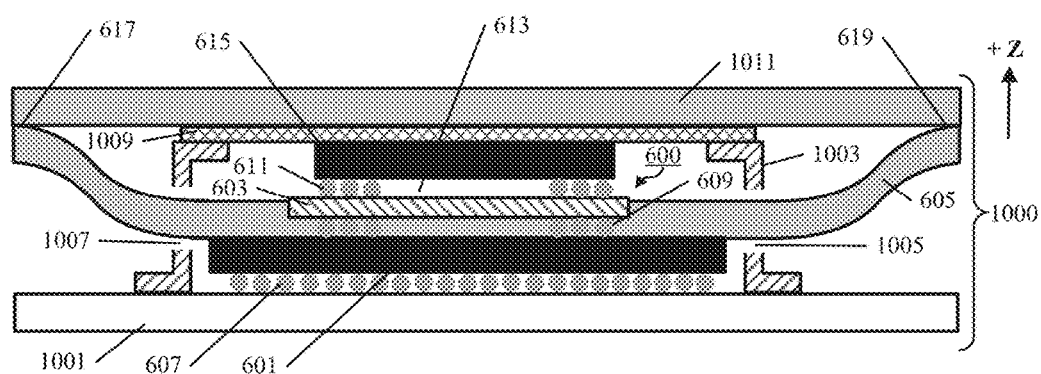
FIG. 10 is a cross-sectional side view of a PCB assembly that uses the chip package stack up of FIG. 6 in accordance with an embodiment.

FIG. 10 is a cross-sectional side view of a PCB assembly 1000 that uses the chip package stack up 600 in accordance with an embodiment. The PCB assembly 1000 includes a PCB 1001 which is connected to the processor chip package 601 using BGA 607. A shield fence 1003 surrounds the chip package stack up 600 and includes slot 1005 and slot 1007 that allow the heat spreader 605 two outwardly extending ends 617, 619 to protrude through the shield fence 1003 to form thermal conductance contacts with a lower surface of a heat spreader 1011 outside of the shield fence 1003. The lower surface of the heat spreader 1011 contacts and adheres to the upper surface of copper tape 1009 to dissipate heat in the x-y plane of the PCB assembly 1000. The copper tape 1009 contacts and adheres to the upper surface of the memory chip package 615 and contacts and adheres to the top of the shield fence 1003.

Figure 11:
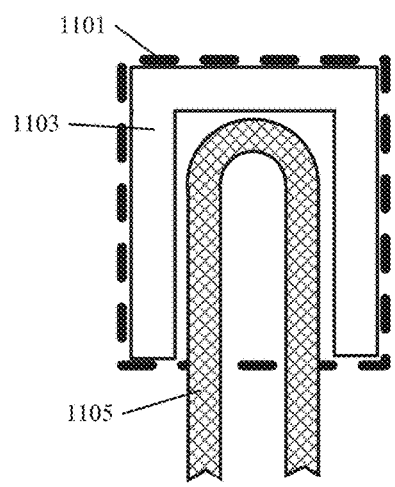
FIG. 11 is a cutaway top view of a chip package stack up having a heat spreader configuration using a heat pipe in accordance with an embodiment.
Figure 12:
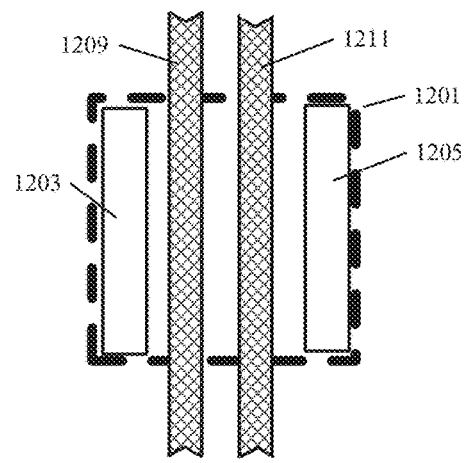
FIG. 12 is a cutaway top view of a chip package stack up having a heat spreader configuration using heat pipes in accordance with another embodiment.

Although the above described embodiments make use of heat spreaders that may be formed using graphite, the heat spreaders may be any type of heat spreader such as, but not limited to, heat pipes. FIG. 11 is a cutaway top view of a chip package stack up having a heat spreader configuration using a heat pipe 1105 in accordance with an embodiment. The heat pipe 1105 is disposed between the two parallel members of an interposer 1103 and extends away from the processor chip package 1101 to carry heat emissions away from the processor chip package 1101 within a PCB assembly. The heat pipe 1105 contacts an upper surface of the processor chip package 1101. An embodiment shown in FIG. 12 uses two parallel interposers 1203, 1205 similar to the embodiment shown in FIG. 3. A first heat pipe 1209 and a second heat pipe 1211 run between the interposers 1203, 1205 and contact an upper surface of a processor chip package 1201.

Figure 13:
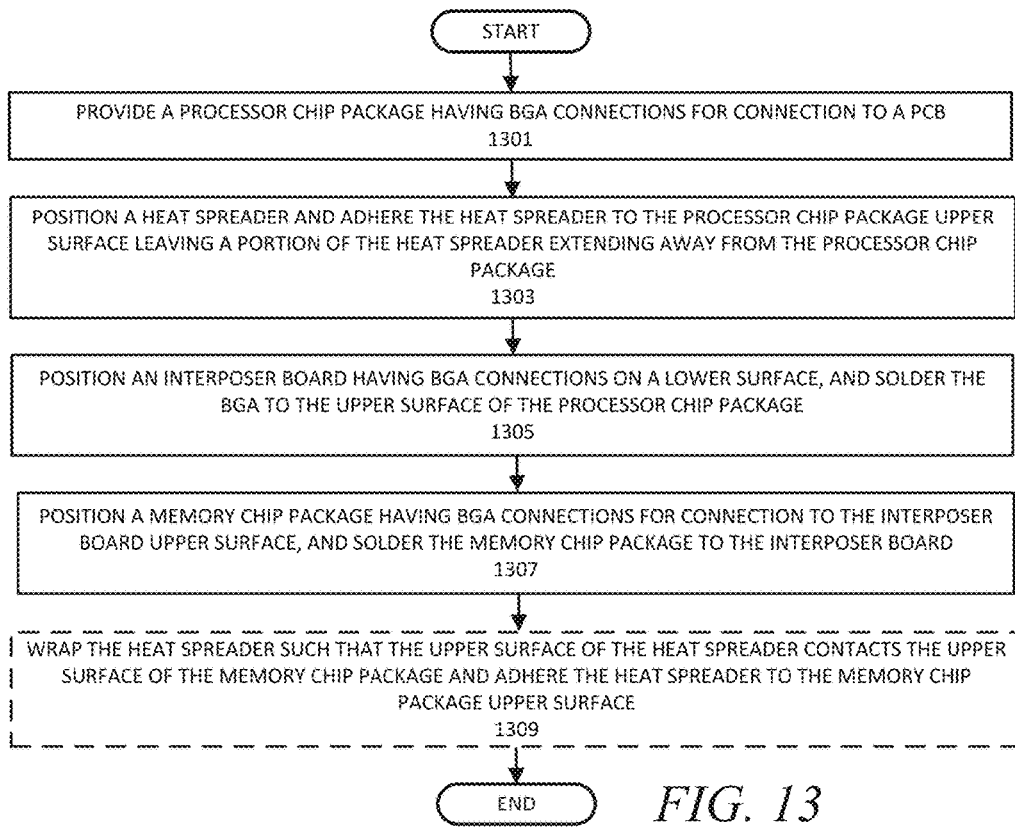
FIG. 13 is a flow chart showing a method of assembly of a chip package stack up, in accordance with various embodiments in which a heat spreader extends outwardly away from an upper surface of a processor chip package, or in which a heat spreader wraps around to contact an upper surface of a memory chip package.

FIG. 13 is a flow chart showing a method of assembly of a chip package stack up, in accordance with various embodiments in which a heat spreader extends outwardly away from an upper surface of a processor chip package, such as in example chip package stack up 400 and example chip package stack up 500. The method may be performed, in whole or in part, by fabrication and assembly equipment such as, but not limited to, one or more surface mount technology (SMT) machines with computer numerical control (CNC) etc.

The method of assembly begins and in operation block 1301, a processor chip package is provided that has BGA connections for connection to a PCB. In operation block 1303, a heat spreader is positioned and is adhered to the processor chip package upper surface such that a portion of the heat spreader extends away from the processor chip package. In operation block 1305, an interposer that has BGA connections on its lower surface to connect to the upper surface of the processor chip package (and connections for connecting to a BGA of a memory chip package on the upper surface) is positioned and soldered to the processor chip package. In operation block 1307, a memory chip package that has BGA connections is positioned and soldered to the interposer. The method of assembly may then terminate. The assembly method thus far results in a chip stack up such as example chip package stack up 400. The additional step 1309 is performed in some embodiments, to result in a chip stack up such as example chip stack up 500. In operation block 1309, the heat spreader is wrapped around such that its upper surface contacts the upper surface of the memory chip package. The heat spreader is adhered to the memory chip package and the method of assembly then terminates.

Figure 14:
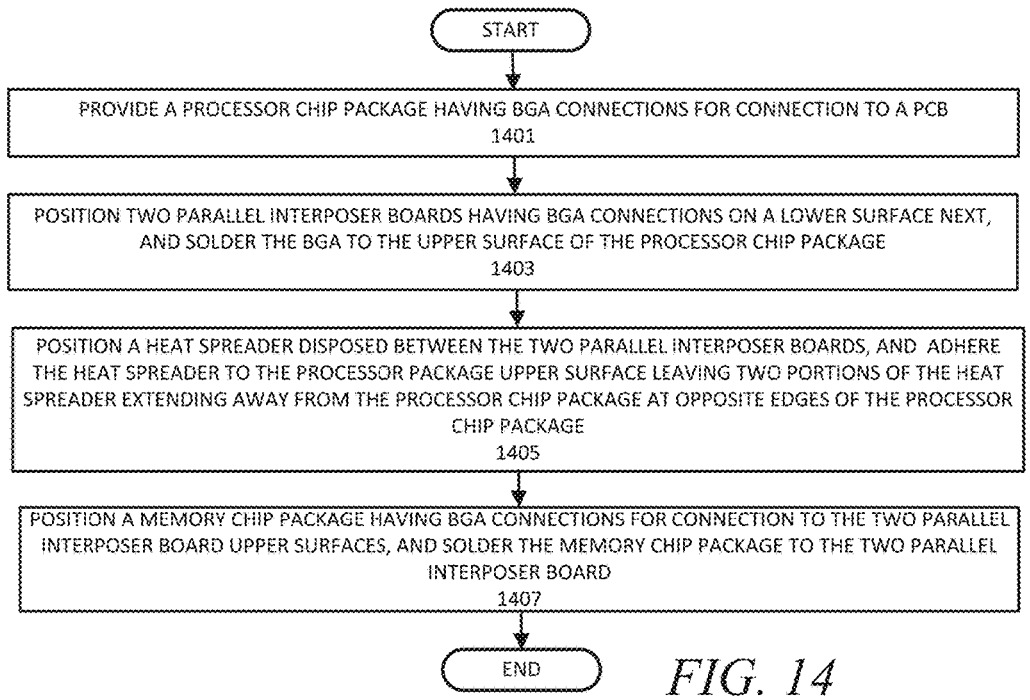
FIG. 14 is a flow chart showing a method of assembly of a chip package stack up, in accordance with various embodiments in which a heat spreader extends outwardly in two directions away from a processor chip package.

FIG. 14 is a flow chart showing a method of assembly of a chip package stack up, that results in a chip stack up such as example chip package stack up 600 in accordance with various embodiments. In operation block 1401, a processor chip package is provided that has BGA connections for connection to a PCB. In operation block 1403, two like interposers that have BGA connections on a lower surface, are positioned in parallel and are soldered to the upper surface of the processor chip package. In operation block 1405, a heat spreader is positioned and disposed between the two parallel interposers, and adhered to the processor chip package upper surface, leaving two portions of the heat spreader extending away from the processor chip package at opposite edges of the processor chip package. In operation block 1407, a memory chip package that has BGA connections for connection to the two parallel interposers is positioned and soldered to the interposers.

It is to be understood that the example methods of assembly of a chip package stack up provided in FIG. 13 and FIG. 14 may be performed, in whole or in part, by fabrication and assembly equipment such as, but not limited to, one or more surface mount technology (SMT) machines with computer numerical control (CNC) etc., however the steps may occur in an order different than the order shown in FIG. 13 and FIG. 14. In other words, the order of operations provided in FIG. 13 and FIG. 14 is not to be construed as limiting the order of steps taken, but are provided as examples only of one particular order that may be used in the various embodiments for purposes of explanation. Also, additional or different steps may be included in some embodiments. For example, wave soldering may occur as a single step after all the components (i.e. processor chip package, interposer, and memory chip package) have been placed and positioned.

The example embodiments described above have all included interposers that elevate a memory chip package above a processor chip package upper surface in order to provide space for a heat spreader between the processor chip package and the memory chip package. One example interposer is constructed using a PCB with via to form connections between the memory chip package BGA and the processor chip package BGA. In accordance with the embodiments, an interposer may be formed in various other ways to elevate the memory chip package. For example in some embodiments, a connector that can connect to the BGA connections may be used as the interposer for elevating the memory chip package. In other example embodiments, the memory chip package may be connected to the processor chip package using a pogo pin array instead of BGA connections where the pogo pin array is the interposer that provides the spacing needed for the heat spreader. Other interposers that can raise the memory chip package above the processor chip package may occur to those of ordinary skill in light of the above described example embodiments and such other interposers are contemplated as being within the scope of the disclosed embodiments. For example, elastomeric connectors, welded wire bonds, gold wires, soldered leadframe, spring-loaded contacts, pogo pins, pins to vertical wires, solder balls with varied volumes, PCB with via (as described above) etc. and the like or some combination thereof may be used in the various embodiments as interposers that form the memory chip package to processor chip package interconnect while providing space in the PoP configuration for the heat spreader.

While various embodiments have been illustrated and described, it is to be understood that the invention is not so limited. Numerous modifications, changes, variations, substitutions and equivalents will occur to those skilled in the art without departing from the scope of the present invention as defined by the appended claims.

What is claimed is:

1. A chip package stack up comprising:
   a processor chip package having a top surface and a bottom surface;
   an interposer, disposed above and connected to the processor chip package top surface;
   a memory chip package disposed above the interposer and connected to the processor chip package through the interposer; and
   a processor chip package heat spreader having a bottom surface adhered to the processor chip package top surface, and having an extending portion that extends outwardly from an edge of the processor chip package.

2. The chip package stack up of claim 1, wherein the processor chip package heat spreader is a graphite heat spreader.

3. The chip package stack up of claim 1, wherein the processor chip package heat spreader is a heat pipe.

4. The chip package stack up of claim 2, wherein the processor chip package heat spreader comprises:
   at least one polyethylene terephthalate (PET) carrier layer; and
   at least one graphite layer.

5. The chip package stack up of claim 1, wherein the processor chip package heat spreader extending portion is folded over a top surface of the memory chip package such that a portion of the processor chip package heat spreader top surface is adhered to the memory chip package top surface.

6. The chip package stack up of claim 5, wherein the processor chip package heat spreader is a graphite heat spreader.

7. The chip package stack up of claim 5, wherein the processor chip package heat spreader is a heat pipe.

8. The chip package stack up of claim 1, further comprising:
   a printed circuit board (PCB) connected to the processor chip package by a ball grid array on the processor chip package bottom surface;
   a shield fence surrounding the processor chip package and the memory chip package;
   copper tape forming a cover over the shield fence and having a bottom surface adhered to the memory chip package top surface;
   a second heat spreader adhered to the copper tape top surface; and
   a contact point between the top surface of the processor chip package heat spreader extending portion and the second heat spreader bottom surface.

9. The chip package stack up of claim 8, further comprising:
   a slot in one section of the shield fence such that the processor chip package heat spreader extending portion protrudes through the slot and outside the shield fence wherein the contact point is outside of the shield fence.

10. The chip package stack up of claim 1, further comprising:

a printed circuit board (PCB) connected to the processor chip package by a ball grid array on the processor chip package bottom surface;

a shield fence surrounding the processor chip package and the memory chip package;

copper tape forming a cover over the shield fence and having a bottom surface adhered to the memory chip package top surface;

a second heat spreader adhered to the copper tape top surface; and a contact point between the top surface of the processor chip package heat spreader extending portion and the copper tape bottom surface, the contact point being within the shield fence.

11. The chip package stack up of claim 5, further comprising:

a printed circuit board (PCB) connected to the processor chip package by a ball grid array on the processor chip package bottom surface;

a shield fence surrounding the processor chip package and the memory chip package;

copper tape forming a cover over the shield fence and having a bottom surface adhered to the bottom surface of the processor chip package heat spreader extending portion; and a second heat spreader adhered to the copper tape top surface.

12. A chip package stack up comprising:

a processor chip package having a top surface and a bottom surface;

two rectangular interposers, disposed above and connected to the processor chip package top surface;

a memory chip package disposed above the two interposers and connected to the processor chip package through the two interposers board; and a heat spreader having a bottom surface adhered to the processor chip package top surface, and having two extending portions that extend outwardly from two edges of the processor chip package.

13. The chip package stack up of claim 12, wherein the processor chip package heat spreader is a graphite heat spreader.

14. The chip package stack up of claim 12, wherein the processor chip package heat spreader is one or more heat pipes.

15. The chip package stack up of claim 12, further comprising:

a printed circuit board (PCB) connected to the processor chip package by a ball grid array on the processor chip package bottom surface;

a shield fence surrounding the processor chip package and the memory chip package;

copper tape forming a cover over the shield fence and having a bottom surface adhered to the memory chip package top surface;

a second heat spreader adhered to the copper tape top surface; and two contact points between the top surfaces of the two processor chip package heat spreader extending portions and the second heat spreader bottom surface.

16. The chip package stack up of claim 15, further comprising:

two slots, with each slot in a section of the shield fence such that each one of the processor chip package heat spreader two extending portions protrudes through one of the slots and outside the shield fence wherein the two contacts point are both outside of the shield fence.

17. A method comprising:

providing a processor chip package that has BGA connections on a bottom surface for connection to a printed circuit board (PCB);

positioning a heat spreader above the processor chip package top surface and adhering the heat spreader to the processor chip package top surface such that a portion of the heat spreader extends away from the processor chip package;

positioning an interposer that has BGA connections on its lower surface and soldering the BGA connections to connections on an upper surface of the processor chip package; and positioning and soldering a memory chip package that has BGA connections to the interposer.

18. The method of claim 17, further comprising:

wrapping the heat spreader around such that its upper surface contacts the upper surface of the memory chip package and adhering the heat spreader to the memory chip package.

19. A method comprising:

providing a processor chip package that has BGA connections on a bottom surface for connection to a PCB;

positioning two like interposers, that have BGA connections on a lower surface, in parallel soldering the BGA connections to the upper surface of the processor chip package;

positioning a heat spreader between the two parallel interposers, and adhering the heat spreader to the processor chip package upper surface, leaving two portions of the heat spreader extending away from the processor chip package at opposite edges of the processor chip package; and positioning a memory chip package that has BGA connections for connection to the two parallel interposers and soldering the BGA connections to the interposers.

* * * * *